(12) United States Patent
Lin

(10) Patent No.: US 9,553,104 B2
(45) Date of Patent: Jan. 24, 2017

(54) SEMICONDUCTOR DEVICE AND METHOD OF FABRICATING THE SAME

(71) Applicant: MACRONIX International Co., Ltd., Hsinchu (TW)

(72) Inventor: Lo-Yueh Lin, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/733,508

(22) Filed: Jun. 8, 2015

(65) Prior Publication Data

US 2016/0358934 A1    Dec. 8, 2016

(51) Int. Cl.
*H01L 21/3213*   (2006.01)
*H01L 27/115*    (2006.01)
*H01L 21/321*    (2006.01)
*H01L 21/28*     (2006.01)

(52) U.S. Cl.
CPC ... *H01L 27/11582* (2013.01); *H01L 21/28282* (2013.01); *H01L 21/32115* (2013.01); *H01L 21/32133* (2013.01)

(58) Field of Classification Search
CPC .................. H01L 27/11582; H01L 21/32133; H01L 21/32115; H01L 21/28282
USPC ........................................................ 257/324
See application file for complete search history.

(56) References Cited

U.S. PATENT DOCUMENTS

| 8,664,761 B1 * | 3/2014 | Hu ................... H01L 27/11519 257/698 |
| 2014/0273372 A1 * | 9/2014 | Sakuma ............ H01L 29/78696 438/268 |

* cited by examiner

*Primary Examiner* — Fernando L Toledo
*Assistant Examiner* — Adam S Bowen
(74) *Attorney, Agent, or Firm* — J.C. Patents

(57) ABSTRACT

Provided is a fabricating method of a semiconductor device, including the following. Fin structures are formed on a substrate, and the adjacent fin structures have an opening therebetween. A conductive material layer is formed to cover the fin structures and fill the opening. The conductive material layer and the fin structures are patterned to form a mesh structure. The mesh structure includes first strips extending in a first direction and second strips extending in a second direction. The first strips and the second strips intersect each other, and the mesh structure has holes. The first strips are located on the substrate at positions corresponding to the fin structures. The second strips are located on the substrate, and the conductive material layer in the second strips spans the fin structures. The hole is formed in the opening and surrounded by the first strips and the second strips.

9 Claims, 13 Drawing Sheets

SEMICONDUCTOR DEVICE AND METHOD OF FABRICATING THE SAME

BACKGROUND OF THE INVENTION

Field of the Invention

The invention relates to a semiconductor device and a method of fabricating the same.

Description of Related Art

With the integration of semiconductor devices, in order to achieve high density and high performance, fabrication of semiconductor devices has evolved into stacking upward in the vertical direction, such that the wafer area can be used more efficiently. Therefore, semiconductor structures or openings having a high aspect ratio are common in small-sized devices.

When fabricating the aforementioned devices, the patterning process is usually carried out with very high etching selectivity in order to form trenches having a high aspect ratio. However, in the case of using very high etching selectivity, the problem of residual material layer on the sidewall of the trench may occur. If there is residual material layer on the sidewall of the trench and the residual material layer is conductive, improper conduction may occur between the semiconductor devices and impair the electrical performance of the devices. In view of the above, how to pattern the material layer (conductive layer) in the semiconductor structure with the trench having a high aspect ratio without leaving residual material layer on the sidewall of the trench is an issue that needs to be addressed.

SUMMARY OF THE INVENTION

The invention provides a fabricating method of a semiconductor device for patterning a material layer (conductive layer) in a semiconductor structure with a trench having a high aspect ratio decreasing or without leaving a residue of the material layer on sidewalls of the trench.

The invention provides a fabricating method of a semiconductor device. The fabricating method of the semiconductor device includes the following. A plurality of fin structures are formed on a substrate, and the adjacent fin structures have an opening therebetween. A conductive material layer is formed to cover the fin structures and fill the opening. The conductive material layer and the fin structures are patterned to form a mesh structure. The mesh structure includes a plurality of first strips extending in a first direction and a plurality of second strips extending in a second direction. The first strips and the second strips intersect one another, and the mesh structure has a plurality of holes. The first strips are located on the substrate at positions corresponding to the fin structures. The second strips are located on the substrate, and the conductive material layer in the second strips spans the fin structures. The hole is respectively located in the opening and surrounded by the first strips and the second strips, and the holes extend to positions closer to the substrate than bottoms of the fin structures.

In an embodiment of the invention, the step of patterning the conductive material layer and the fin structures includes performing a non-selective etching process.

In an embodiment of the invention, an etching selectivity of the conductive material layer and the fin structures is controlled to be 0.7 to 1.3 for performing the non-selective etching process.

In an embodiment of the invention, the fabricating method further includes performing a planarization process on the conductive material layer before patterning the conductive material layer and the fin structures.

In an embodiment of the invention, the fin structures and the conductive material layer are patterned such that a height of a sidewall of each hole in the mesh structure is greater than a height of the first strip.

In an embodiment of the invention, the height of the sidewall of each hole in the mesh structure exceeds the height of the first strip by 30% or more of the height of the first strip.

In an embodiment of the invention, the step of forming the fin structures includes the following. A stack layer is formed on the substrate. The stack layer includes at least one conductive layer and at least one dielectric layer that are stacked alternately. A charge storage layer is formed to cover the substrate at a bottom of the opening and a surface of the stack layer.

In an embodiment of the invention, the fabricating method further includes the following. A plurality of dielectric pillars are formed to at least fill the holes. The conductive material layer in the first strips and the dielectric pillars are patterned such that the patterned conductive material layer forms a plurality of comb structures. Each comb structure includes a plurality of comb portions and a connection portion. The comb portions are respectively inserted into the opening between the adjacent fin structures and are in contact with sidewalls of the adjacent fin structures. The connection portion extends in the second direction and is located on the fin structures to connect the comb portions.

In an embodiment of the invention, the conductive material layer in the first strips and the dielectric pillars are patterned such that a length of the connection portion in the first direction is smaller than a length of each dielectric pillar in the first direction.

In an embodiment of the invention, after patterning the conductive material layer in the first strips and the dielectric pillars, a portion of the fin structures and the dielectric pillars between the connection portion in the adjacent comb structures is removed by performing an over etching process.

In an embodiment of the invention, the step of forming the dielectric pillars and patterning the conductive material layer in the first strips and the dielectric pillars includes the following. A dielectric material layer is formed to cover the mesh structure and fill the holes. The dielectric material layer and the conductive material layer in the first strips are patterned to form the comb structures, a plurality of cap layers, and the dielectric pillars. Each comb structure includes the comb portions and the connection portion. Each cap layer is located on the connection portion and extends in the second direction.

The invention further provides a semiconductor device. The semiconductor device includes a substrate, a plurality of fin structures, a plurality of comb structures, and a plurality of dielectric pillars. The fin structures are located on the substrate and extend in a first direction. The adjacent fin structures have an opening therebetween. The comb structures include a conductive material, and each of the comb structures includes a plurality of comb portions and a connection portion. The comb portions are respectively inserted into the opening between the adjacent fin structures and are in contact with sidewalls of the adjacent fin structures. The connection portion extends in the second direction and is located on the fin structures to connect the comb portions. The dielectric pillars are respectively inserted into the opening between the adjacent fin structures and are in contact with the sidewalls of the adjacent fin structures and the comb portions. The dielectric pillars extend to positions closer to the substrate than bottoms of the fin structures.

In an embodiment of the invention, the fin structures respectively include a stack layer and a charge storage layer. The stack layer includes at least one conductive layer and at least one dielectric layer stacked alternately. The charge storage layer covers the substrate at a bottom of the opening and a surface of the stack layer.

In an embodiment of the invention, a first angle of the fin structures is smaller than a second angle of the comb portions. The first angle is an angle between the sidewall of the fin structure and the surface of the substrate. The second angle is an angle between a sidewall of the comb portion and the surface of the substrate.

In an embodiment of the invention, the dielectric pillars have different heights.

In an embodiment of the invention, the height of each dielectric pillar is greater than a height of each fin structure.

In an embodiment of the invention, the height of each dielectric pillar exceeds the height of each fin structure by 30% or more of the height of the fin structure.

In an embodiment of the invention, a length of the connection portion in the first direction is smaller than a length of each dielectric pillar in the first direction.

In an embodiment of the invention, a first height of a portion of each fin structure is smaller than a second height of another portion of the fin structure. The first height is a height of each fin structure between the adjacent comb structures. The second height is a height of each fin structure under the comb structure.

In an embodiment of the invention, the semiconductor device further includes a plurality of cap layers. The cap layers are located on the connection portion and extend in the second direction.

Based on the above, according to the invention, the fin structures and the material layer (conductive layer) are patterned simultaneously to form the mesh structure. Thereby, the material layer (conductive layer) in the semiconductor structure with the trench having a high aspect ratio is patterned without leaving a residue of the material layer on the sidewall of the trench. This method effectively prevents improper conduction between the semiconductor devices and thus improves the electrical performance of the devices.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
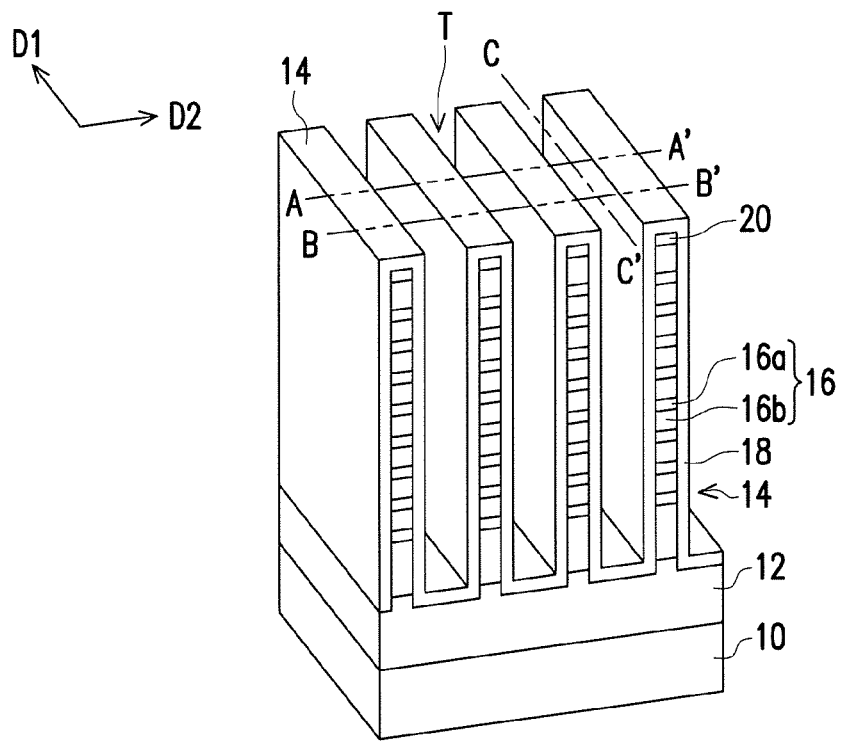
FIG. 1A to FIG. 1F are schematic perspective views showing a fabricating method of a semiconductor device according to an embodiment of the invention.
Figure 1B:
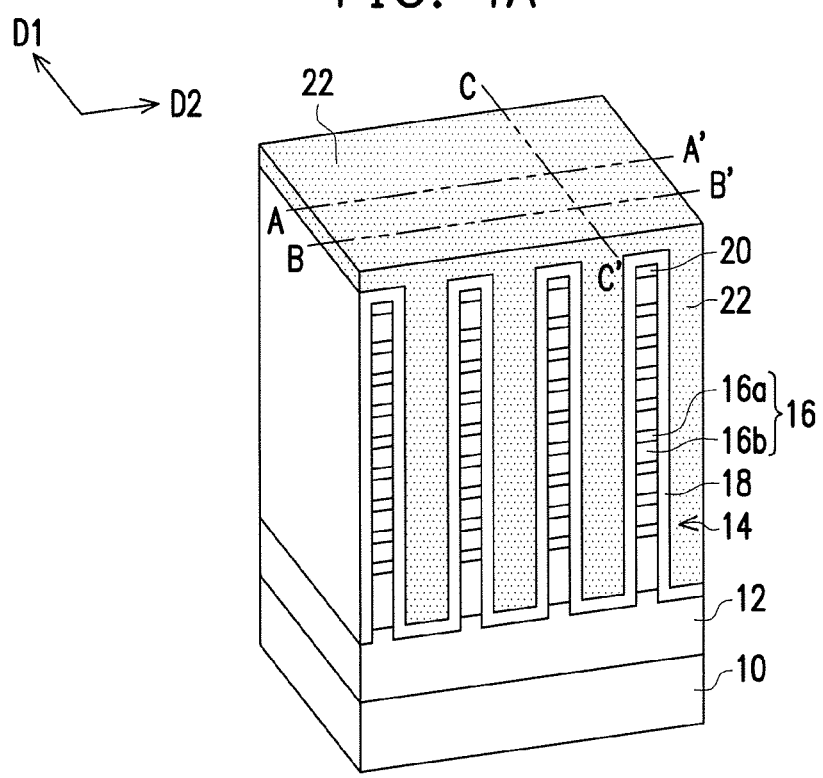
Figure 1C:
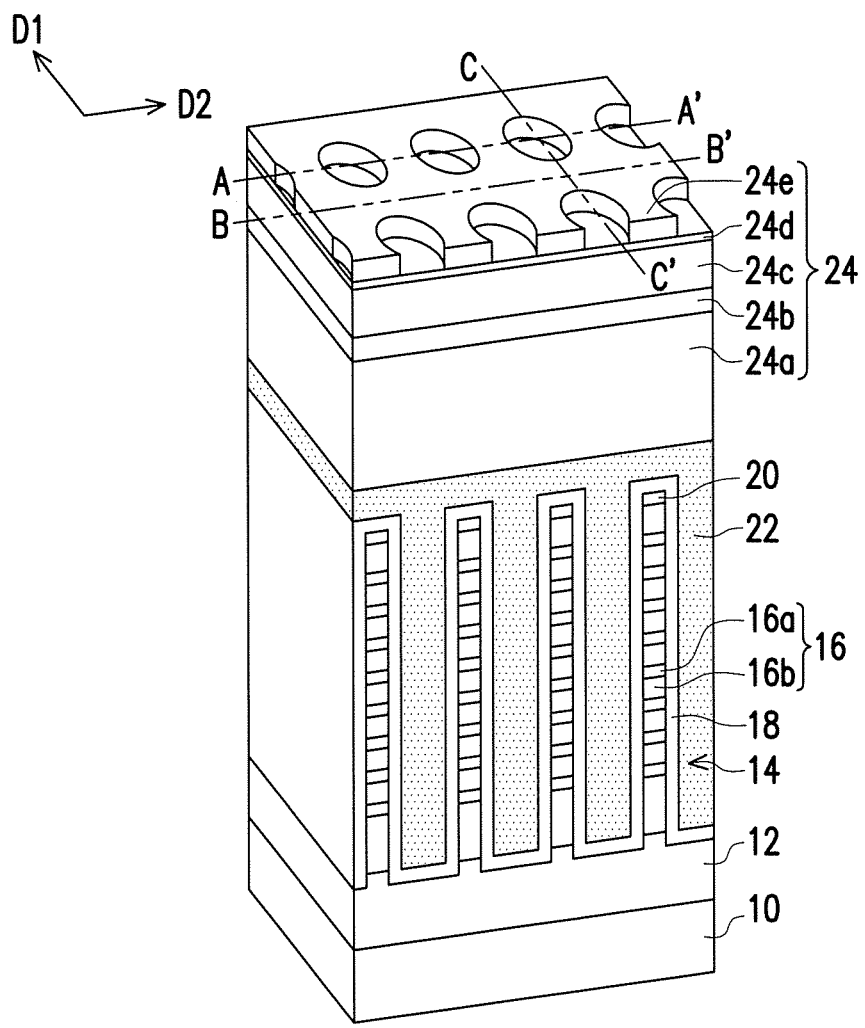
Figure 1D:
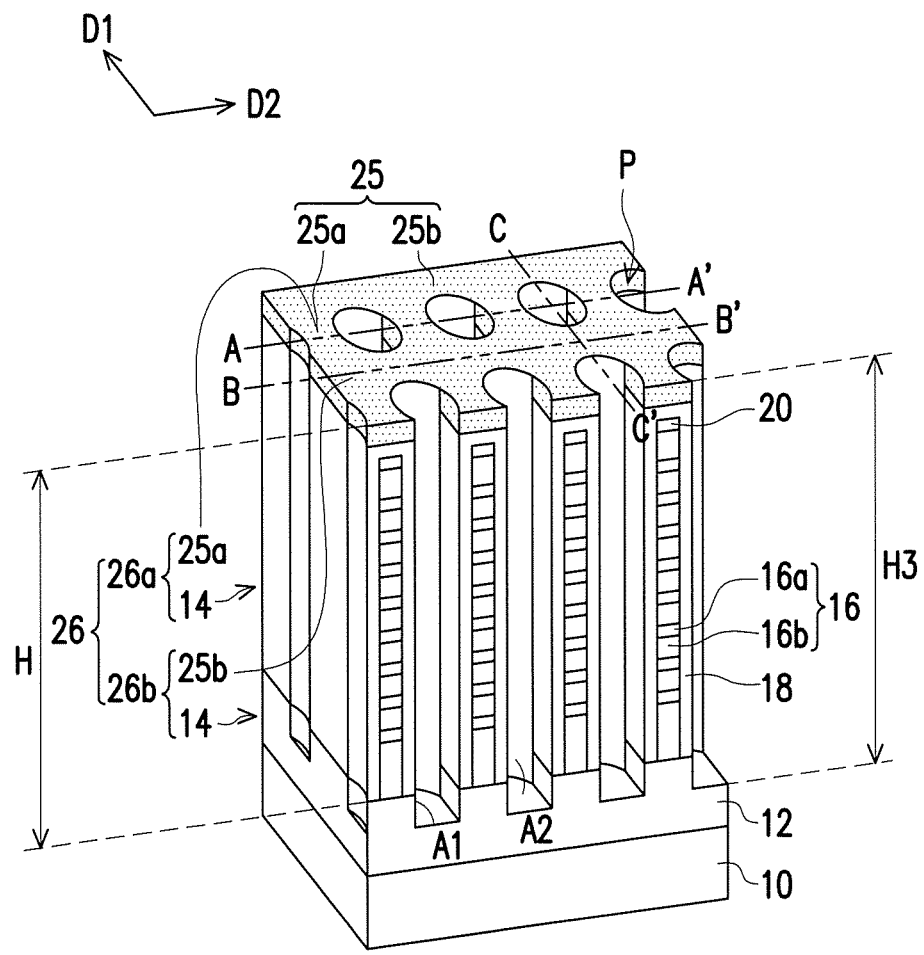
Figure 1E:
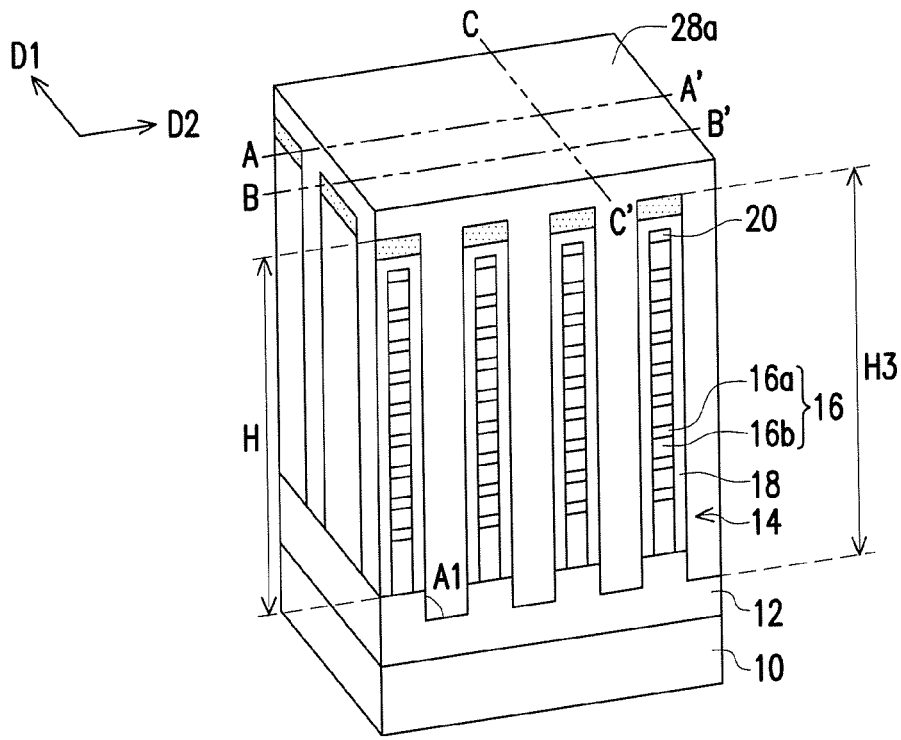
Figure 1F:
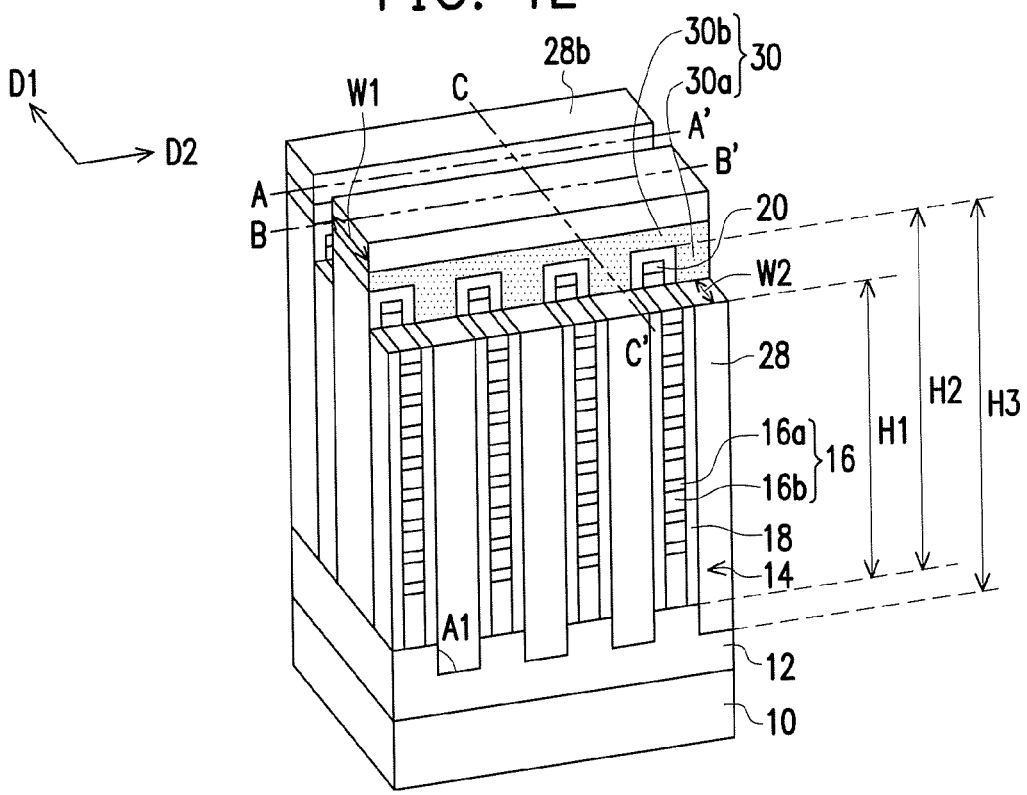
Figure 2A:
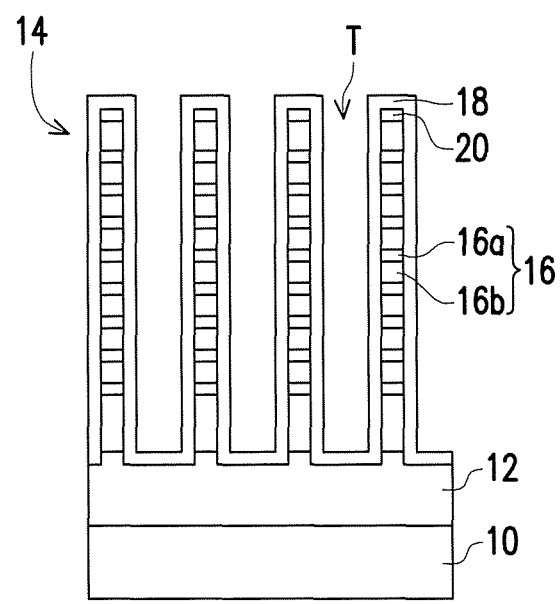
FIG. 2A to FIG. 2F are schematic cross-sectional views, taken along the line A-A' of FIG. 1A to FIG. 1F, showing the fabricating method of the semiconductor device.
Figure 2B:
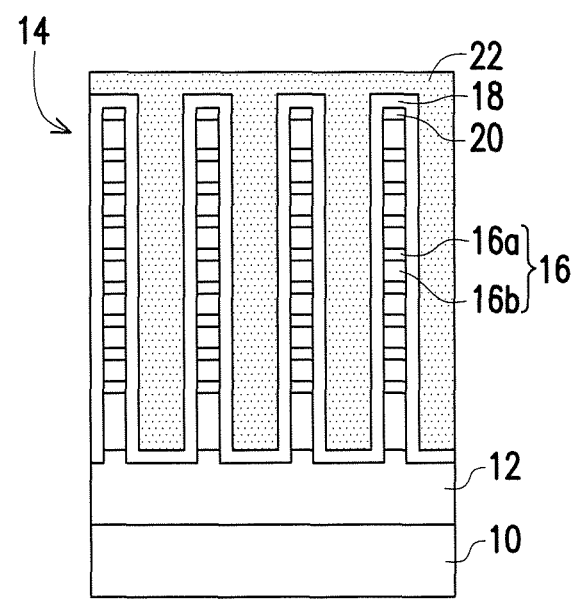
Figure 2C:
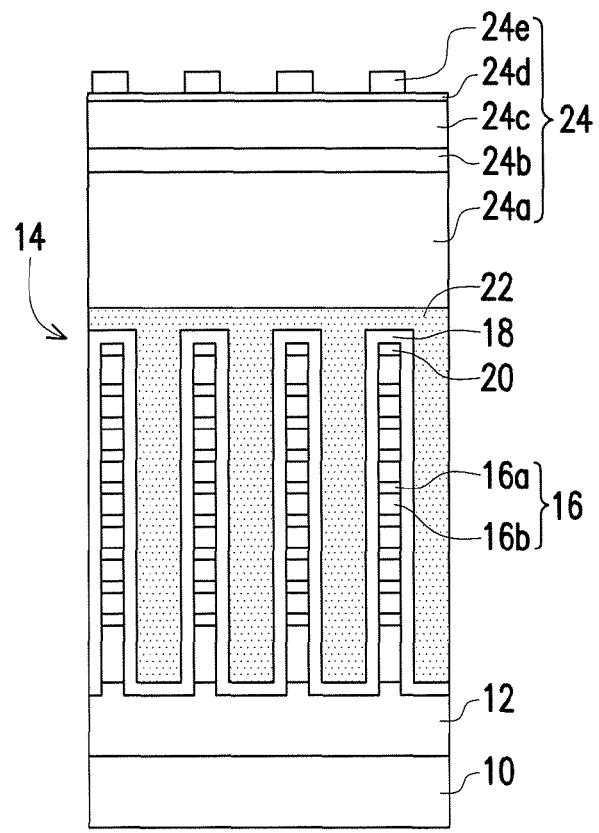
Figure 2D:
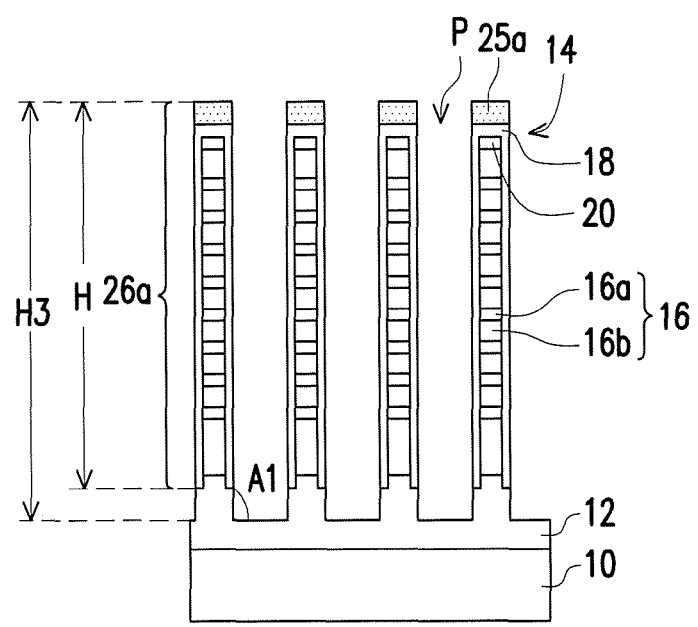
Figure 2E:
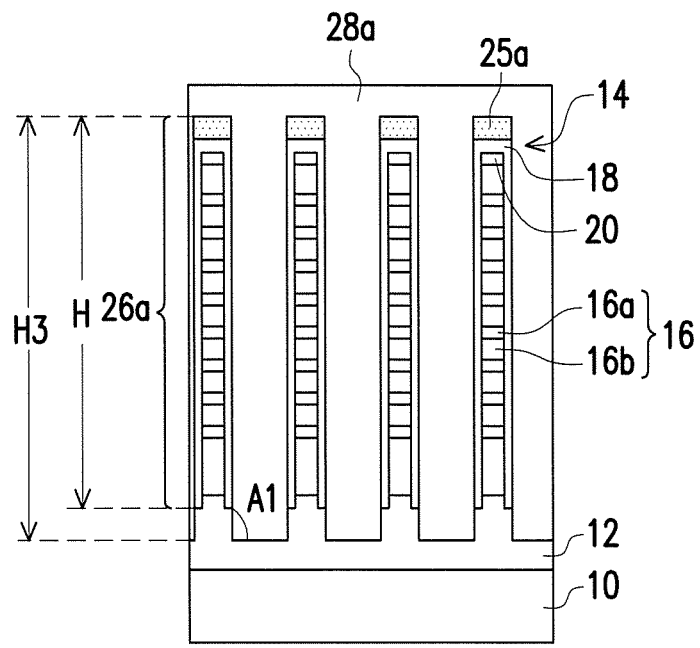
Figure 2F:
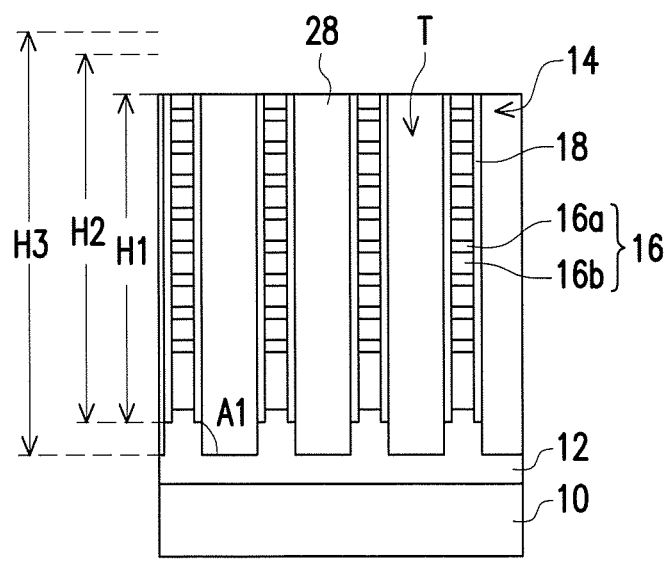
Figure 3A:
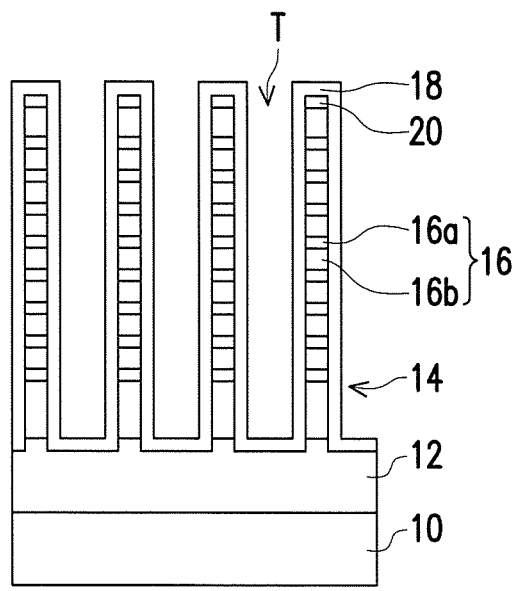
FIG. 3A to FIG. 3F are schematic cross-sectional views, taken along the line B-B' of FIG. 1A to FIG. 1F, showing the fabricating method of the semiconductor device.
Figure 3B:
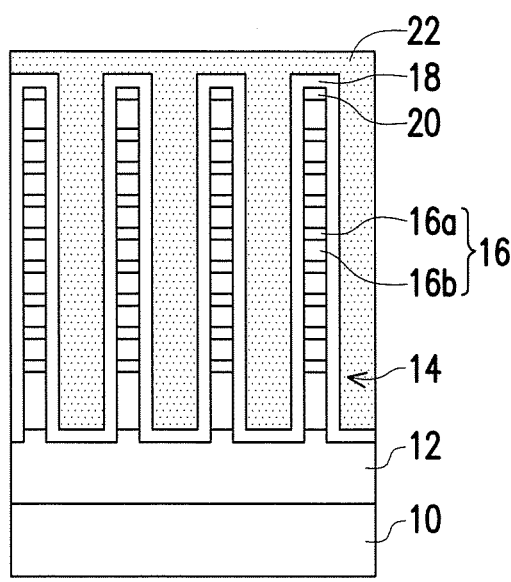
Figure 3C:
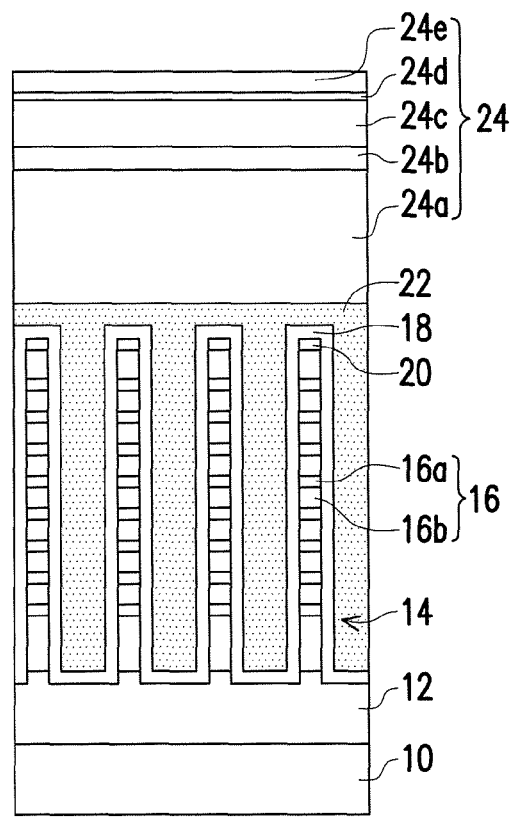
Figure 3D:
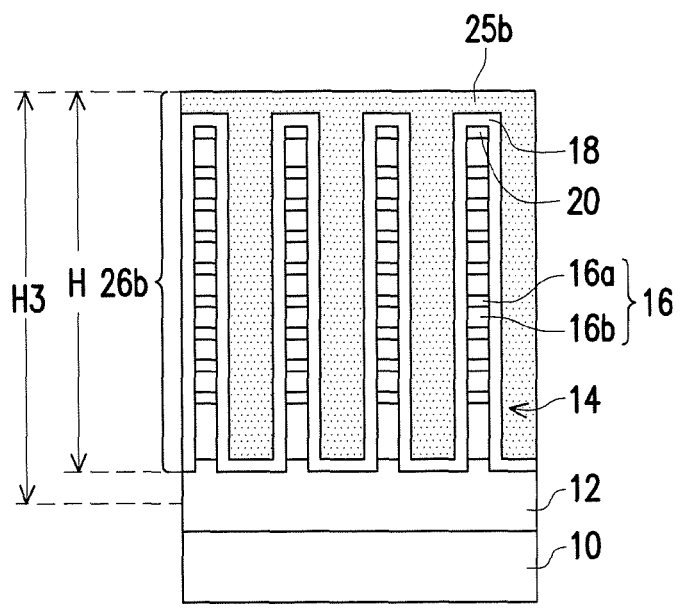
Figure 3E:
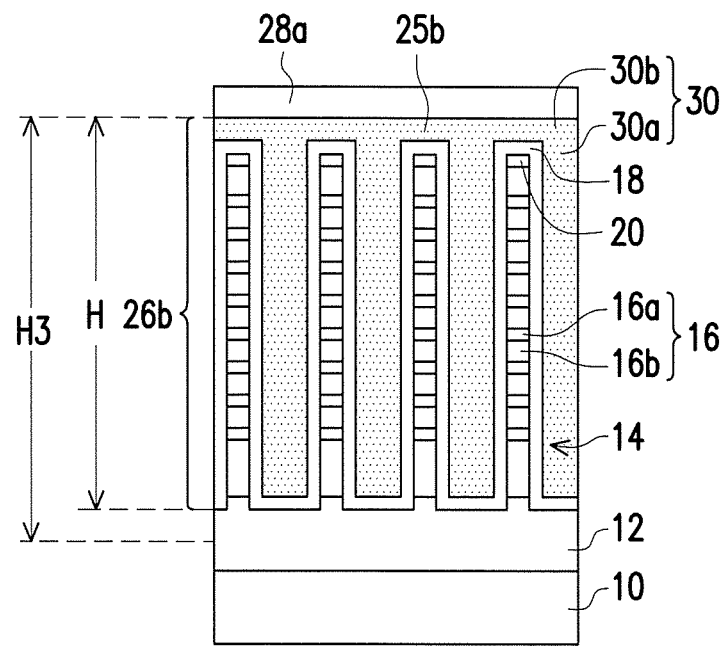
Figure 3F:
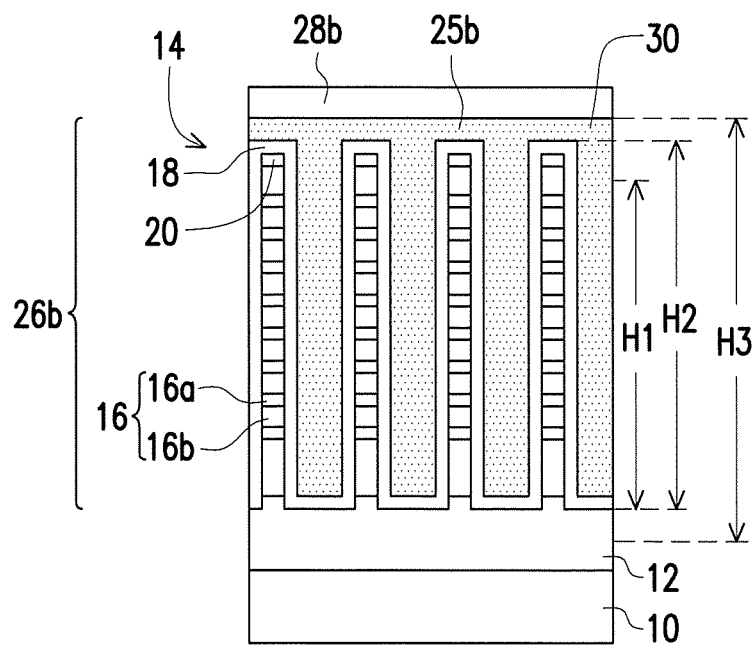
Figure 4A:
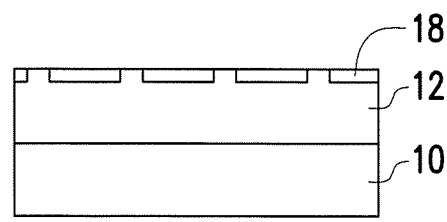
FIG. 4A to FIG. 4F are schematic cross-sectional views, taken along the line C-C' of FIG. 1A to FIG. 1F, showing the fabricating method of the semiconductor device.
Figure 4B:
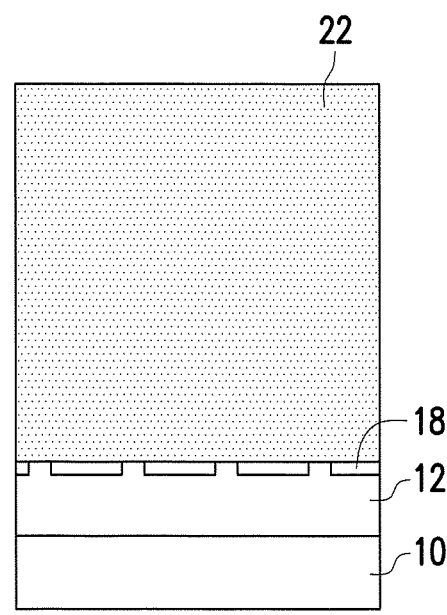
Figure 4C:
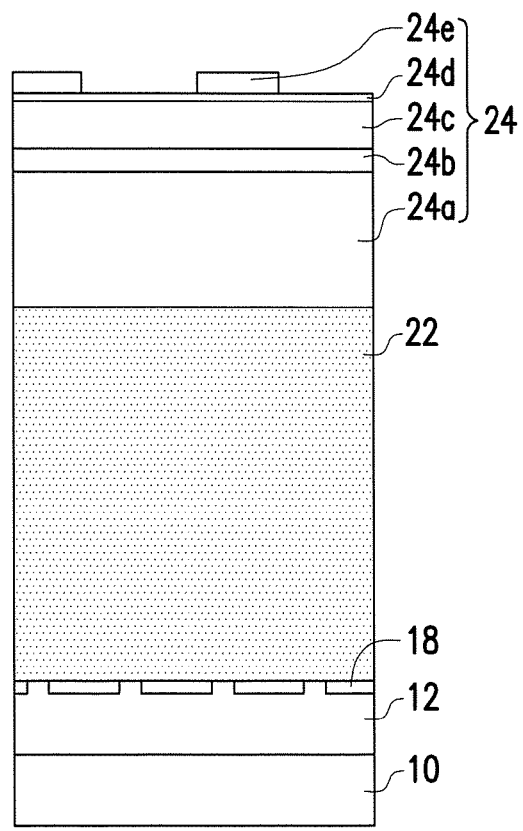
Figure 4D:
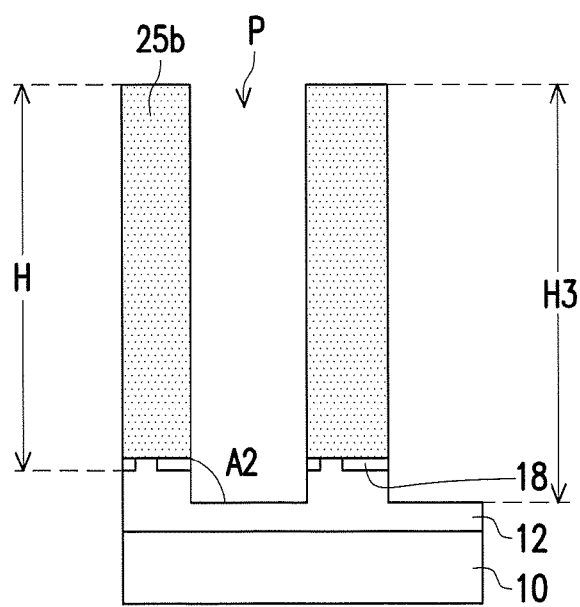
Figure 4E:
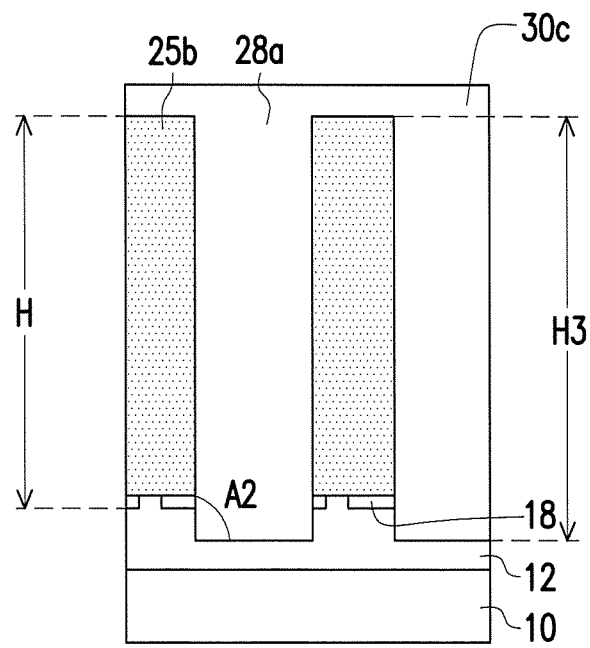
Figure 4F:
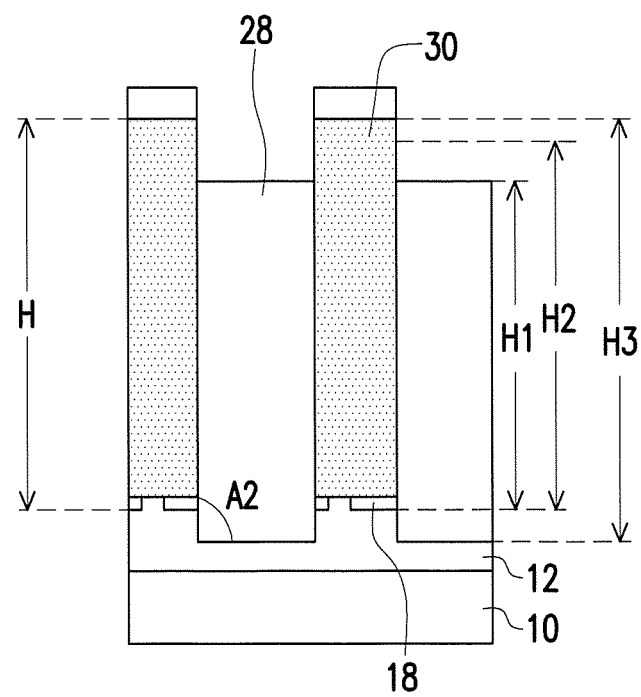

FIG. 1A to FIG. 1F are schematic perspective views showing a fabricating method of a semiconductor device according to an embodiment of the invention. FIG. 2A to FIG. 2F are schematic cross-sectional views, taken along the line A-A' of FIG. 1A to FIG. 1F, showing the fabricating method of the semiconductor device. FIG. 3A to FIG. 3F are schematic cross-sectional views, taken along the line B-B' of FIG. 1A to FIG. 1F, showing the fabricating method of the semiconductor device. FIG. 4A to FIG. 4F are schematic cross-sectional views, taken along the line C-C' of FIG. 1A to FIG. 1F, showing the fabricating method of the semiconductor device.

With reference to FIG. 1A, FIG. 2A, FIG. 3A, and FIG. 4A, first, a substrate 10 is provided. The substrate 10 may include a semiconductor material, an insulator material, a conductive material, or any combination of the foregoing materials. The material of the substrate 10 is a material composed of at least one selected from a group consisting of Si, Ge, SiGe, GaP, GaAs, SiC, SiGeC, InAs, and InP, or any physical structure suitable for a fabricating process of the invention, for example. The substrate 10 includes a single-layer structure or a multi-layer structure. In addition, a silicon on insulator (SOI) substrate may be used as the substrate 10. The substrate 10 is silicon or silicon germanium, for example.

With reference to FIG. 1A, FIG. 2A, FIG. 3A, and FIG. 4A, a dielectric layer 12 is then formed on the substrate 10. The dielectric layer 12 includes an oxide, a nitride, an oxy-nitride, or a low dielectric constant material having a dielectric constant smaller than 4. In an embodiment, the dielectric layer 12 is a bottom oxide layer (BOX), for example. A thickness of the dielectric layer 12 is in a range of 1000 Å to 5000 Å, for example. A method of forming the dielectric layer 12 includes performing thermal oxidation or chemical vapor deposition, for example.

With reference to FIG. 1A, FIG. 2A, FIG. 3A, and FIG. 4A, next, a stack layer 16 is formed on the dielectric layer 12. The stack layer 16 includes a plurality of conductive layers 16a and a plurality of dielectric layers 16b that are stacked alternately. A material of the conductive layer 16a includes an undoped semiconductor or a doped semiconductor, such as polysilicon or doped polysilicon. A thickness of each conductive layer 16a is in a range of 1001 to 500 Å, for example. A thickness of each dielectric layer 16b is in a range of 200 Å to 600 Å, for example. The dielectric layer 16b and the dielectric layer 12 may be formed of the same or different materials. The material of the dielectric layer 16b may include an oxide, a nitride, an oxynitride, or a low dielectric constant material having a dielectric constant smaller than 4. A method of forming the conductive layer 16a and the dielectric layer 16b includes performing thermal oxidation or chemical vapor deposition, for example.

With reference to FIG. 1A, FIG. 2A, FIG. 3A, and FIG. 4A, thereafter, a charge storage layer 18 is forming to cover a surface of the stack layer 16 and a surface of the dielectric layer 12, so as to form a plurality of fin structures 14. A material of the charge storage layer 18 includes an oxide, a nitride, or a combination of the foregoing. Specifically, the material of the charge storage layer 18 includes a silicon nitride, a silicon oxide, or a combination of the foregoing. The charge storage layer 18 may be a single layer or include multiple layers. In an embodiment, the charge storage layer 18 is a single-layer silicon nitride layer, for example. In another embodiment, the charge storage layer 18 is a composite layer of oxide/nitride/oxide (ONO), for example. A thickness of the charge storage layer 18 is in a range of 100 Å to 300 Å, for example. A method of forming the charge storage layer 18 includes performing chemical vapor deposition or thermal oxidation, for example.

With reference to FIG. 1A, FIG. 2A, FIG. 3A, and FIG. 4A, the adjacent fin structures 14 have an opening T therebetween. The opening T may be fainted with any length, width, or shape. A cross section of the opening T may be in any shape, such as a V shape, a U shape, a rhombic shape, or a combination of the foregoing, for example. However, it should be noted that the invention is not limited thereto.

With reference to FIG. 1A, FIG. 2A, FIG. 3A, and FIG. 4A, in an embodiment, each fin structure 14 may selectively include a first hard mask layer 20. The first hard mask layer 20 is disposed between the stack layer 16 and the charge storage layer 18, for example. Nevertheless, the invention is not limited thereto. The first hard mask layer 20 may be a single layer or include multiple layers. A material of the first hard mask layer 20 includes a silicon oxide, a silicon nitride, or other materials having a high Young's modulus, for example. A thickness of the first hard mask layer 20 is in a range of 100 Å to 1000 Å, for example. A method of forming the first hard mask layer 20 includes performing chemical vapor deposition, for example.

With reference to FIG. 1A, FIG. 1B, FIG. 2B, FIG. 3B, and FIG. 4B, a conductive material layer 22 is disposed to cover the surface of the charge storage layer 18 of the fin structure 14 and the surface of the dielectric layer 12 and fill the opening T. The conductive material layer 22 includes an undoped semiconductor or a doped semiconductor, such as polysilicon or doped polysilicon. A thickness of the conductive material layer 22 on a top of the fin structure 14 is in a range of 500 Å to 1500 Å, for example. A method of forming the conductive material layer 22 includes performing chemical vapor deposition, for example.

With reference to FIG. 1C, FIG. 2C, FIG. 3C, and FIG. 4C, a mask structure 24 is formed on the conductive material layer 22. The mask structure 24 includes a first advanced patterning film (APF) 24a, a dielectric anti-reflective coating film (DARC) 24b, a second advanced patterning film 24c, a silicon-containing hard-mask bottom anti-reflection coating (SHB) 24d, and a patterned photoresist layer 24e in sequence. A material of the first advanced patterning film 24a is amorphous carbon, for example. A material of the dielectric anti-reflective coating film 24b is silicon oxynitride, for example. A material of the second advanced patterning film 24c is amorphous carbon, for example. A material of the silicon-containing hard-mask bottom anti-reflection coating 24d is an organosilicon polymer, polysilane, or a combination of the foregoing, for example. A material of the patterned photoresist layer 24e is a positive photoresist, a negative photoresist, or a combination of the foregoing, for example. A thickness of the first advanced patterning film 24a is in a range of 4000 Å to 15000 Å, for example. A thickness of the dielectric anti-reflective coating film 24b is in a range of 300 Å to 2000 Å, for example. A thickness of the second advanced patterning film 24c is in a range of 500 Å to 4000 Å, for example. A thickness of the silicon-containing hard-mask bottom anti-reflection coating 24d is in a range of 200 Å to 1000 Å, for example. A thickness of the patterned photoresist layer 24e is in a range of 200 Å to 3000 Å, for example. A method of forming the first advanced patterning film 24a, the dielectric anti-reflective coating film 24b, the second advanced patterning film 24c, and the silicon-containing hard-mask bottom anti-reflection coating 24d includes performing chemical vapor deposition, for example. A method of forming the patterned photoresist layer 24e includes performing spin coating in combination with a lithography process, for example. In an embodiment, before forming the mask structure 24, a planarization process may be performed on the conductive material layer 22 to facilitate the subsequent patterning process.

With reference to FIG. 1C, FIG. 1D, FIG. 2D, FIG. 3D, and FIG. 4D, the conductive material layer 22 is patterned and a portion of the charge storage layer 18 and a portion of the dielectric layer 12 are removed by performing a non-selective etching process with the mask structure 24 as a mask, so as to form a mesh structure 26. The non-selective etching process means etching the conductive material layer 22, the charge storage layer 18, and the dielectric layer 12 at substantially the same etching rate. In an embodiment, an etching selectivity of the conductive material layer 22 to the charge storage layer 18 and an etching selectivity of the conductive material layer 22 to the dielectric layer 12 are respectively in a range of 0.7 to 1.3, for example. It should be noted that the aforementioned range of the etching selectivity is given as an example, and the invention is not limited thereto. The etching selectivity may be adjusted as required as long as the conductive material layer 22 on the sidewall of the opening for forming an isolating structure can be completely removed. The non-selective etching process is a dry etching process, for example. The dry etching process may be sputter etching, reactive ion etching, etc. In an embodiment, a gas used in the non-selective etching process is $NF_3$, HBr, $CH_4$, $N_2$, He, Ar, $SF_6$, $CH_2F_2$, and $CH_3F$, for example.

With reference to FIG. 1D, FIG. 2D, FIG. 3D, and FIG. 4D, thereafter, the mask structure 24 is removed to expose the mesh structure 26. The mesh structure 26 includes a plurality of first strips 26a and a plurality of second strips 26b that intersect each other. Specifically, the first strips 26a extend in a first direction D1 and are located at positions corresponding to the fin structures 14. That is, each first strip 26a includes the fin structure 14 and a first strip conductive layer 25a on the fin structure 14. The second strips 26b extend in a second direction D2 and are located on the substrate 10. A second strip conductive layer 25b of the second strip 26b spans the fin structures 14. That is, each second strip 26b includes a portion of the fin structure 14 and the second strip conductive layer 25b spanning the fin structures 14. The first strip conductive layer 25a and the second strip conductive layer 25b are formed by patterning the conductive material layer 22 in FIG. 1C, FIG. 2C, FIG. 3C, and FIG. 4C. The first strip conductive layer 25a and the second strip conductive layer 25b intersect each other to form a mesh layer 25.

In other words, the mesh structure 26 has a plurality of holes P. The holes P are surrounded by the first strips 26a and the second strips 26b. The hole P is respectively located in the opening T between the adjacent two fin structures 14 (with reference to FIG. 1A and FIG. 1D). The hole P extends into the dielectric layer 12 under the charge storage layer 18. That is to say, a bottom of the hole P is closer to the substrate 10 than a bottom of the fin structure 14. A method of removing the mask structure 24 includes performing dry etching, for example. The dry etching may be sputter etching, reactive ion etching, etc.

Since the mesh structure 26 is formed by the non-selective etching process, a residue of the conductive material layer 22 on the sidewall of the opening for forming the isolating structure is prevented or reduced effectively to avoid improper conduction between the semiconductor devices. Moreover, since the conductive material layer 22 is patterned to form the mesh layer 25, the structure has sufficient support in two directions, and thus collapse of the pattern is prevented.

With reference to FIG. 1C, FIG. 1D, FIG. 2D, FIG. 3D, and FIG. 4D, a distance between adjacent two holes P in the first direction D1 is in a range of 200 Å to 400 Å, for example. A distance between adjacent two holes P in the second direction D2 is in a range of 200 Å to 400 Å, for example. An area of the hole P is in a range of 5000 nm² to 10000 nm², for example. The hole P has a circular shape, a rectangular shape, a rhombic shape, or a combination of the foregoing, for example. It should be noted that the shape, area, and spacing of the holes P are given as examples, and the invention is not limited thereto. The holes P may have any shape, area, or distance therebetween as long as the conductive material layer 22 on the sidewall of the opening (i.e., the hole P) for forming the isolating structure can be completely removed.

With reference to FIG. 1C, FIG. 1D, FIG. 2D, FIG. 3D, and FIG. 4D, in an embodiment, a sidewall of each first strip 26a is more oblique than a sidewall of each second strip 26b. Specifically, a first angle A1 of each first strip 26a may be smaller than a second angle A2 of each second strip 26b. The first angle A1 is an angle between the sidewall of the first strip 26a at the bottom of the hole P and the surface of the substrate 10. The second angle A2 is an angle between the sidewall of the second strip 26b at the bottom of the hole P and the surface of the substrate 10.

With reference to FIG. 1D, FIG. 2D, FIG. 3D, and FIG. 4D, in the etching process, the etching is non-uniform due to a loading effect. As a result, the heights H3 of the sidewalls of the holes P formed in the mesh structure 26 may not be completely the same. However, since the holes P are filled with a dielectric material in the subsequent process, the different heights H3 of the holes P would not affect the overall electrical performance of the device. In an embodiment, the heights H3 of the sidewalls of the holes P in the mesh structure 26 differ from one another. In another embodiment, the height H3 of the sidewall of each hole P in the mesh structure 26 is greater than a height H of the first strip 26a. For example, the height H3 of the sidewall of each hole P in the mesh structure 26 exceeds the height H of the first strip 26a by 30% or more, or by 40% or more of the height H. In an embodiment, the height H3 of the sidewall of the hole P is in a range of 7000 Å to 12000 Å. The height H3 of the sidewall of each hole P in the mesh structure 26 exceeds the height H of the first strip 26a by 1000 Å to 5000 Å, for example. By setting the height H3 of the sidewall of each hole P in the mesh structure 26 to exceed the height H of the first strip 26a by 30% or more of the height H, it is ensured that the conductive material layer 22 on the sidewall of the opening for forming the isolating structure can be completely removed.

With reference to FIG. 1E, FIG. 2E, FIG. 3E, and FIG. 4E, then, a dielectric material layer 28a is disposed to cover the mesh structure 26 and fill the holes P. A material of the dielectric material layer 28a includes an oxide, a nitride, an oxy-nitride, or a low dielectric constant material having a dielectric constant smaller than 4. A thickness of the dielectric material layer 28a on the mesh structure 26 is in a range of 200 Å to 1000 Å, for example. A method of forming the dielectric material layer 28a includes performing chemical vapor deposition, for example.

With reference to FIG. 1D, FIG. 1E, FIG. 1F, FIG. 2F, FIG. 3F, and FIG. 4F, the dielectric material layer 28a and the mesh structure 26 are patterned by performing a patterning process, such as lithography and etching processes, so as to form a plurality of comb structures 30 and dielectric pillars 28. Specifically, by performing the patterning process, cap layers 28b on the surfaces of the second strips 26b and the dielectric pillars 28 in the holes P are retained. The cap layers 28b are located on a connection portion 30b and extend in the second direction D2. Furthermore, by performing the patterning process, the first strips 26a of the mesh structure 26 are partially removed, which leaves the comb structures 30. Each comb structure 30 includes a plurality of comb portions 30a and the connection portion 30b. Each comb portion 30a is inserted into the opening T between the adjacent two fin structures 14 and is in contact with the sidewall of the charge storage layer 18 in the adjacent fin structures 14 (with reference to FIG. 1A and FIG. 1F). The connection portion 30b connects the comb portions 30a and extends in the second direction D2. In an embodiment, a length of the connection portion 30b in the first direction D1 in a range of 400 Å to 600 Å, for example. In an embodiment, a spacing between the connection portions 30b is in a range of 200 Å to 400 Å, for example. In an embodiment, a length W1 of the connection portion 30b in the first direction D1 is smaller than a length W2 of each dielectric rod 28 in the first direction D1.

In addition, when performing the patterning process, after formation of the cap layers 28b and the comb structures 30, a portion of the fin structures 14 between the cap layers 28b may be removed by performing an over etching process. Thus, the height (a first height H1) of each fin structure 14 between adjacent two comb structures 30 is smaller than the height (a second height H2) of each fin structure 14 under the comb structure 30. In an embodiment, the first height H1 is smaller than the second height H2 by 500 Å to 1000 Å. Owing to the loading effect, the conductive material between adjacent two comb structures 30 may not be removed completely. The steps of performing the over etching process and removing a portion of the fin structures 14 between the cap layers 28b can prevent conduction between the adjacent two comb structures 30, caused by residual conductive material, after the patterning process.

With reference to FIG. 1F, FIG. 2F, FIG. 3F, and FIG. 4F, the semiconductor device of the invention includes the substrate 10, the dielectric layer 12, a plurality of fin structures 14, a plurality of comb structures 30, and a plurality of dielectric pillars 28. The dielectric layer 12 is located on the substrate 10. The fin structures 14 are located on the dielectric layer 12 and extend in the first direction D1. The fin structures 14 include the stack layer 16 and the charge storage layer 18. The stack layer 16 includes a plurality of conductive layers 16a and a plurality of dielectric layers 16b that are stacked alternately. The adjacent fin structures 14 have the opening T therebetween. The charge storage layer 18 covers the surfaces of the stack layer 16 and the dielectric layer 12.

With reference to FIG. 1F, FIG. 2F, FIG. 3F, and FIG. 4F, the comb structure 30 may be a conductive material. Each comb structure 30 includes a plurality of comb portions 30a and the connection portion 30b. The comb portion 30a is inserted into the opening T between the adjacent two fin structures 14 and is in contact with the sidewall of the charge storage layer 18 in the adjacent fin structures 14. The connection portion 30b extends in the second direction D2, and is located on the charge storage layer 18 and connects the comb portions 30a.

The dielectric pillar 28 is inserted into the opening T between the adjacent two fin structures 14 and is in contact with the sidewalls of the adjacent fin structures 14 and the comb portion 30a of the comb structure 30. In addition, the dielectric pillar 28 extends to a position closer to the substrate 10 than the fin structure 14 (that is, the dielectric pillar 28 extends into the dielectric layer 12 under the charge storage layer 18). The heights H3 of the dielectric pillars 28 may not be completely the same. In an embodiment, the heights H3 of the dielectric pillars 28 differ from one another. In another embodiment, the height H3 of each dielectric pillar 28 is greater than the height H1 of the fin structure 14. For example, the height H3 of each dielectric pillar 28 exceeds the height H1 of the fin structure 14 by 30% or more, or by 40% or more of the height H1.

In an embodiment, the sidewall of each fin structure 14 is more oblique than the sidewall of each comb portion 30a. Specifically, the first angle A1 of each fin structure 14 (i.e., the charge storage layer 18) is smaller than the second angle A2 of each comb portion 30a. The first angle A1 is an angle between the sidewall of each fin structure 14 and the surface of the substrate 10, and the second angle A2 is an angle between the sidewall of each comb portion 30a and the surface of the substrate 10. The length W1 of each connection portion 30b in the first direction D1 may be different from the length W2 of each dielectric pillar 28 in the first direction D1. In an embodiment, the length W1 of each connection portion 30b in the first direction D1 is smaller than the length W2 of each dielectric pillar 28 in the first direction D1.

With reference to FIG. 1F, FIG. 2F, FIG. 3F, and FIG. 4F, the fin structures 14 may have different heights in the first direction D1. In an embodiment, the first height H1 of a portion of each fin structure 14 is smaller than the second height H2 of another portion of the fin structure 14. The first height H1 refers to a height of each fin structure 14 between the adjacent two comb structures 30. The second height H2 refers to a height of each fin structure 14 under the comb structure 30.

With reference to FIG. 1F, FIG. 2F, FIG. 3F, and FIG. 4F, the semiconductor device of the invention further includes a plurality of cap layers 28b. The cap layer 28b is located on the connection portion 30b of the comb structure 30 and extends in the second direction D2.

In conclusion, according to the embodiment of the invention, a residue of the material layer that remains on the sidewall of the trench is removed effectively by performing the non-selective etching process and forming the mesh structure, thereby preventing improper conduction between the semiconductor devices. Moreover, since the conductive material layer is patterned into a mesh shape, the structure has sufficient support in two directions, and thus collapse of the pattern is prevented.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device, comprising:
a substrate;
a plurality of fin structures located on the substrate and extending in a first direction, wherein the adjacent fin structures have an opening therebetween;
a plurality of comb structures comprising a conductive material, wherein each of the comb structures comprises:
a plurality of comb portions respectively inserted into the opening between the adjacent fin structures and in contact with sidewalls of the adjacent fin structures; and
a connection portion extending in a second direction and located on the fin structures to connect the comb portions; and
a plurality of dielectric pillars respectively inserted into the opening between the adjacent fin structures and in contact with the sidewalls of the adjacent fin structures and the comb portions, wherein the dielectric pillars extend to positions closer to the substrate than bottoms of the fin structures.

2. The semiconductor device according to claim 1, wherein the fin structures respectively comprise a stack layer and a charge storage layer, wherein the stack layer comprises at least one conductive layer and at least one dielectric layer stacked alternately, and the charge storage layer covers the substrate at a bottom of the opening and a surface of the stack layer.

3. The semiconductor device according to claim 1, wherein a first angle of the fin structures is smaller than a second angle of the comb portions, wherein the first angle is an angle between the sidewall of the fin structure and the surface of the substrate, and the second angle is an angle between a sidewall of the comb portion and the surface of the substrate.

4. The semiconductor device according to claim 1, wherein the dielectric pillars have different heights.

5. The semiconductor device according to claim 1, wherein the height of each dielectric pillar is greater than a height of each fin structure.

6. The semiconductor device according to claim 5, wherein the height of each dielectric pillar exceeds the height of each fin structure by 30% or more of the height of the fin structure.

7. The semiconductor device according to claim 1, wherein a length of the connection portion in the first direction is smaller than a length of each dielectric pillar in the first direction.

8. The semiconductor device according to claim 1, wherein a first height of a portion of each fin structure is smaller than a second height of another portion of the fin structure, wherein the first height is a height of each fin structure between the adjacent comb structures, and the second height is a height of each fin structure under the comb structure.

9. The semiconductor device according to claim 2, further comprising: a plurality of cap layers located on the connection portion and extending in the second direction, and wherein the stack layer is stacked in a third direction which is perpendicular to the first direction.

* * * * *